United States Patent
Nakashima et al.

(10) Patent No.: US 9,153,848 B2
(45) Date of Patent: Oct. 6, 2015

(54) ELECTRONIC DEVICE, BATTERY PACK, AND METHOD OF COMPUTING BATTERY PACK CAPACITY

(75) Inventors: Ryoichi Nakashima, Tokyo (JP); Ryota Hashizume, Kanagawa (JP); Jiro Moriya, Chiba (JP); Yukio Tsuchiya, Kanagawa (JP); Junya Yamada, Aichi (JP); Takashi Mutou, Aichi (JP)

(73) Assignee: Sony Corporation, Tokyo (JP)

( * ) Notice: Subject to any disclaimer, the term of this patent is extended or adjusted under 35 U.S.C. 154(b) by 521 days.

(21) Appl. No.: 13/274,715

(22) Filed: Oct. 17, 2011

(65) Prior Publication Data

US 2012/0150465 A1    Jun. 14, 2012

(30) Foreign Application Priority Data

Dec. 14, 2010    (JP) .................................. 2010-278148

(51) Int. Cl.
G01R 31/36 (2006.01)
H01M 10/48 (2006.01)
H01M 10/42 (2006.01)
H01M 10/0525 (2010.01)

(52) U.S. Cl.
CPC ............ *H01M 10/48* (2013.01); *H01M 10/425* (2013.01); *H01M 10/488* (2013.01); *G01R 31/361* (2013.01); *G01R 31/3682* (2013.01); *H01M 10/0525* (2013.01)

(58) Field of Classification Search
CPC ............................. H01M 10/48; G01R 31/361
See application file for complete search history.

(56) References Cited

U.S. PATENT DOCUMENTS

| 5,847,566 | A  | * | 12/1998 | Marritt et al. ................. 324/427 |
| 7,693,671 | B2 | * | 4/2010  | Okumura et al. ............... 702/63 |
| 8,359,174 | B2 | * | 1/2013  | Nakashima et al. ............ 702/63 |
| 2003/0214303 | A1 | | 11/2003 | Ying |
| 2003/0221134 | A1 | | 11/2003 | Ebato et al. |
| 2004/0117137 | A1 | * | 6/2004  | Jin et al. ......................... 702/63 |
| 2004/0212349 | A1 | | 10/2004 | Tsuchiya et al. |
| 2010/0036628 | A1 | * | 2/2010  | Plestid ............................ 702/63 |

FOREIGN PATENT DOCUMENTS

| EP | 2 151 694 A2 | 2/2010 |
| JP | 2003-240830  | 8/2003 |
| JP | 2009-44895   | 2/2009 |

OTHER PUBLICATIONS

U.S. Appl. No. 13/287,286, filed Nov. 2, 2011, Nakashima, et al.
Extended European Search Report issued Mar. 12, 2012 in Patent Application No. 11191892.6.
U.S. Appl. No. 14/061,241, filed Oct. 23, 2013, Nakashima, et al.
Office Action issued Aug. 28, 2014 in European Patent Application No. 11 191 892.6.

* cited by examiner

*Primary Examiner* — Andrew Schechter
*Assistant Examiner* — Peter Ngo
(74) *Attorney, Agent, or Firm* — Sony Corporation

(57) ABSTRACT

An electronic device includes a battery capacity computing unit configured to compute a current full-charge capacity of a currently inserted battery apparatus having secondary cells. The battery capacity computing unit acquires at least information on a full-charge capacity of the battery apparatus in a brand-new state and information on the battery charge/discharge cycle count from the battery apparatus, retains a correction coefficient used when computing the current full-charge capacity of the battery apparatus, and calculates the current full-charge capacity of the battery apparatus using the information on the full-charge capacity of the battery apparatus in a brand-new state, the information on the battery charge/discharge cycle count, and the correction coefficient.

11 Claims, 10 Drawing Sheets

FIG. 6

| | COMMAND | RESPONSE | |
|---|---|---|---|
| 181 | 0x01<br>BRAND-NEW 100% | BRAND-NEW<br>100% CAPACITY | 182 |
| 183 | 0x02<br>CHARGE/DISCHARGE<br>CYCLE COUNT | CHARGE/DISCHARGE<br>CYCLE COUNT | 184 |
| 185 | 0x03<br>CURRENT INTEGRATION<br>VALUE | CURRENT INTEGRATION<br>VALUE | 186 |

FIG. 11

| CORRECTION COEFFICIENT [%/CYCLE] | | AVERAGE CURRENT [A] | | | |
|---|---|---|---|---|---|
| | | 1 | 2 | 3 | 4 |
| PEAK CURRENT [A] | 1 | 0.1 | — | — | — |
| | 2 | 0.15 | 0.2 | — | — |
| | 3 | 0.17 | 0.25 | 0.3 | — |
| | 4 | 0.2 | 0.27 | 0.35 | 0.4 |
| | 5 | 0.25 | 0.3 | 0.37 | 0.45 |
| | 6 | 0.27 | 0.35 | 0.4 | 0.47 |
| | 7 | 0.3 | 0.37 | 0.45 | 0.5 |
| | 8 | 0.35 | 0.4 | 0.47 | 0.55 |
| | 9 | 0.37 | 0.45 | 0.5 | 0.57 |
| | 10 | 0.4 | 0.47 | 0.55 | 0.6 |

ELECTRONIC DEVICE, BATTERY PACK, AND METHOD OF COMPUTING BATTERY PACK CAPACITY

BACKGROUND

The present disclosure relates to an electronic device, a battery pack, and a method of computing battery pack capacity.

Recently, portable electronic devices such as digital video cameras, for example, have proliferated, and much importance is placed on the performance of secondary cells installed in such electronic devices. Batteries of the lithium-ion type are one example of such secondary cells.

Also, portable electronic devices such as the above which use secondary cells as a power source are often equipped with battery charge level display functions. Particularly, since with lithium-ion secondary cells the battery cell voltage is gradual and has the property of decreasing linearly except immediately after beginning discharge and immediately before ending discharge, the battery charge level can be predicted comparatively accurately and displayed.

Additionally, battery packs are being sold which house components such as battery cell voltage and current detector circuits as well as microcontrollers, which conduct various correction processes, etc. like the above in the same package as the battery cells in order to more accurately predict the battery capacity. Such battery packs are provided with functions for communicating with a device that acts as the discharge load and outputting various internally detected values to the device. Having received such detected values, the device is able to compute and display the battery charge level (see Japanese Unexamined Patent Application Publication No. 2009-44895, for example).

SUMMARY

Typically, a battery such as a lithium-ion battery wears down with repeated charges/discharges, and the usable current integration value at full charge decreases. For this reason, if an electronic device operating with such a battery attempts to display the battery charge level as a percentage, the current integration value for which 100% is displayed should be corrected in conjunction with the degree of battery wear.

Also, batteries such as lithium-ion batteries typically have different degrees of wear even when the number of charge/discharge cycles is the same, due to differences in the magnitude of the current when charging/discharging and how the current flows (whether current flows steadily or intermittently).

However, with the technology described in Japanese Unexamined Patent Application Publication No. 2009-44895, the current integration value for which 100% is displayed is corrected only according to the number of charge/discharge cycles in all cases, despite the magnitude of the current and the way the current flows differing according to the device in which the battery is used and how that device is used. For this reason, there has been a problem in that an accurate battery charge level may not be displayed as a percentage, depending on the device in use.

Also, with the technology described in Japanese Unexamined Patent Application Publication No. 2009-44895, there has been a problem in that, for models in which the magnitude of the current when charging/discharging and the way the current flows greatly differ, the battery charge level may not be displayed as a percentage and a separate battery should be prepared in order to display an accurate battery charge level as a percentage.

Thus, in light of the above problems, it is desirable to provide a new and improved electronic device, battery pack, and method of computing battery pack capacity able to accurately correct the current battery capacity value at full charge.

An electronic device in accordance with an embodiment of the present technology is provided with a battery capacity computing unit configured to compute the current full-charge capacity of a currently inserted battery apparatus having secondary cells, wherein the battery capacity computing unit acquires at least information on the full-charge capacity of the battery apparatus in a brand-new state and information on the battery charge/discharge cycle count from the battery apparatus, retains a correction coefficient used when computing the current full-charge capacity of the battery apparatus, and calculates the current full-charge capacity of the battery apparatus using the information on the full-charge capacity of the battery apparatus in a brand-new state, the information on the battery charge/discharge cycle count, and the correction coefficient.

It may also be configured such that the battery capacity computing unit computes the current full-charge capacity of the battery apparatus according to the following formula:

Current full-charge capacity of the battery apparatus=Full-charge capacity of the battery apparatus in a brand-new state×(1−Correction coefficient×Charge/discharge cycle count).

It may also be configured such that the battery capacity computing unit acquires a current integration value obtained by integrating detected values for the charge/discharge current flowing through the battery apparatus, and computes the battery charge level ratio of the battery apparatus using the current full-charge capacity of the battery apparatus and the current integration value.

It may also be configured such that a display unit that displays information is additionally provided, wherein the battery capacity computing unit causes the display unit to display the battery charge level ratio of the battery apparatus.

It may also be configured such that the battery capacity computing unit acquires the correction coefficient from the battery apparatus.

It may also be configured such that the battery capacity computing unit calculates the current full-charge capacity of the battery apparatus using a correction coefficient acquired from the battery apparatus and a correction coefficient retained in the battery capacity computing unit.

It may also be configured such that the battery capacity computing unit retains a plurality of correction coefficients, and calculates the current full-charge capacity of the battery apparatus by selecting the correction coefficient according to the inserted battery apparatus.

It may also be configured such that the battery capacity computing unit calculates the current full-charge capacity of the battery apparatus by modifying the correction coefficient according to the inserted battery apparatus.

It may also be configured such that the battery capacity computing unit dynamically determines the correction coefficient from an average value and a peak value of detected values for the charge/discharge current flowing through the battery apparatus.

Also, a battery pack in accordance with another embodiment of the present technology is provided with secondary cells, wherein the battery pack retains information on its full-charge capacity in a brand-new state, information on its charge/discharge cycle count, and a correction coefficient used to compute its current full-charge capacity, and transmits the information on its full-charge capacity in a brand-new state, the information on its charge/discharge cycle count, and the correction coefficient to an electronic device into which the battery pack is inserted, and additionally transmits information on a current integration value obtained by integrating the magnitude of current internally flowing therethrough.

Also, a method of computing battery pack capacity in accordance with another embodiment of the present technology involves computing the current full-charge capacity of a currently inserted battery apparatus having secondary cells, wherein computing the current full-charge capacity involves acquiring at least information on the full-charge capacity of the battery apparatus in a brand-new state and information on the battery charge/discharge cycle count from the battery apparatus, retaining a correction coefficient used when computing the current full-charge capacity of the battery apparatus, and calculating the current full-charge capacity of the battery apparatus using the information on the full-charge capacity of the battery apparatus in a brand-new state, the information on the battery charge/discharge cycle count, and the correction coefficient.

According to the present technology as described above, it is possible to provide a new and improved electronic device, battery pack, and method of computing battery pack capacity able to accurately correct the current battery capacity value at full charge.

BRIEF DESCRIPTION OF THE DRAWINGS

FIG. 6 illustrates exemplary contents of communication data transmitted between an interchangeable-lens camera main unit and a battery pack;

FIG. 11 illustrates an exemplary correction coefficient table; and

DETAILED DESCRIPTION OF EMBODIMENTS

Hereinafter, an ideal embodiment of the present technology will be described in detail and with reference to the attached drawings. In the specification and drawings herein, redundant description is reduced or omitted by giving identical reference signs to components having practically identical functional configurations.

Furthermore, the description will proceed in the following order.
<1. Embodiment of present technology>
  [1-1. Exemplary exterior of interchangeable-lens camera]
  [1-2. Exemplary information displayed by interchangeable-lens camera main unit]
  [1-3. Functional configurations of respective apparatus in interchangeable-lens camera]
  [1-4. Configuration executing a communication process]
  [1-5. Operation of interchangeable-lens camera]
<2. Conclusion>

Figure 1:
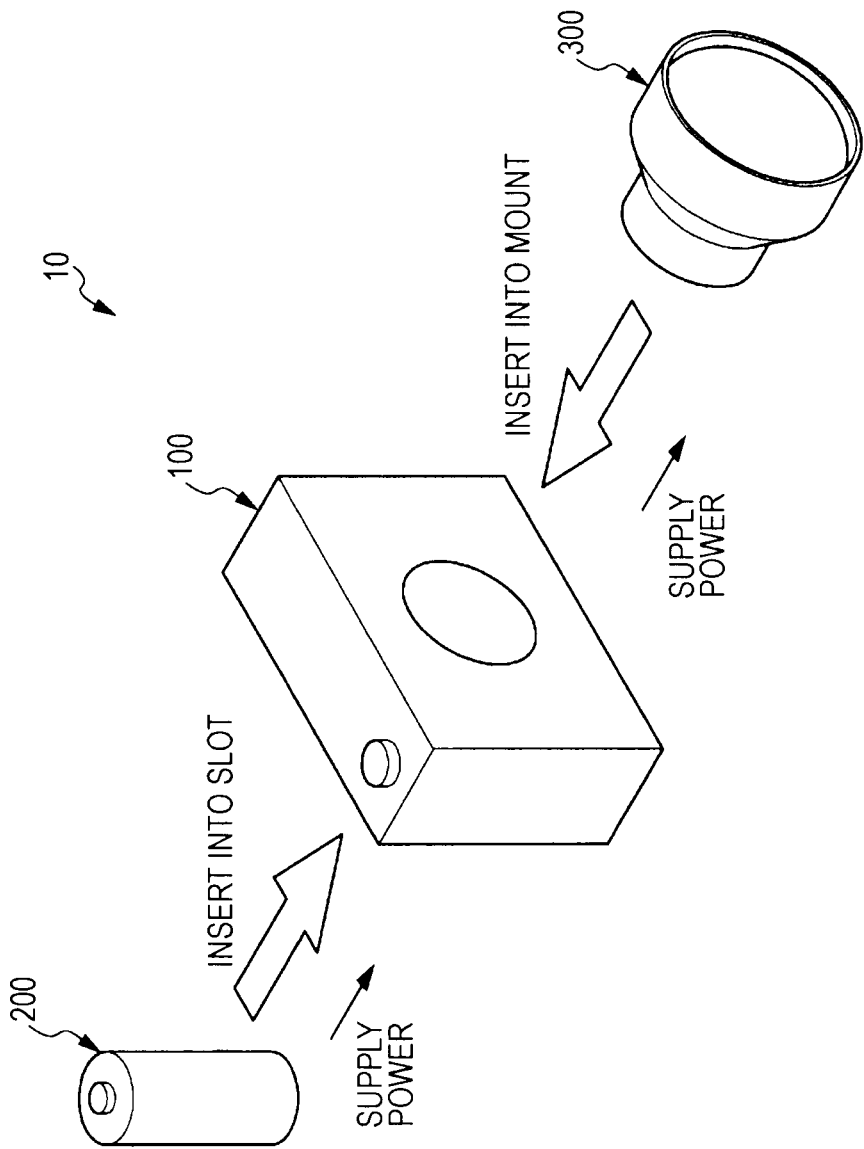
FIG. 1 illustrates an exemplary configuration of an interchangeable-lens camera in accordance with an embodiment of the present technology.

1. EMBODIMENT OF PRESENT TECHNOLOGY 1-1. Exemplary Exterior of Interchangeable-Lens Camera First, an exemplary configuration of an interchangeable-lens camera in accordance with an embodiment of the present technology will be described. FIG. 1 illustrates an exemplary configuration of an interchangeable-lens camera 10 in accordance with an embodiment of the present technology. Hereinafter, an exemplary configuration of an interchangeable-lens camera 10 in accordance with an embodiment of the present technology will be described using FIG. 1.

As illustrated in FIG. 1, an interchangeable-lens camera 10 in accordance with an embodiment of the present technology includes an interchangeable-lens camera main unit 100, a battery pack 200, and an interchangeable lens 300.

The interchangeable-lens camera main unit 100 is an example of an electronic device in accordance with an embodiment of the present technology, and is used in a state where a battery pack 200 internally provided with secondary cells such as a lithium-ion battery is inserted therein and an interchangeable lens 300 is mounted thereon. The interchangeable-lens camera main unit 100 operates by being fed with power from the inserted battery pack 200, and the interchangeable lens 300 operates by being fed with power from the interchangeable-lens camera main unit 100 receiving power from the battery pack 200.

The foregoing thus describes an exemplary configuration of an interchangeable-lens camera 10 in accordance with an embodiment of the present technology using FIG. 1. Next, exemplary information displayed by the interchangeable-lens camera main unit 100 of an interchangeable-lens camera 10 in accordance with an embodiment of the present technology will be described.

1-2. Exemplary Information Displayed by Interchangeable-Lens Camera Main Unit

Figure 2:
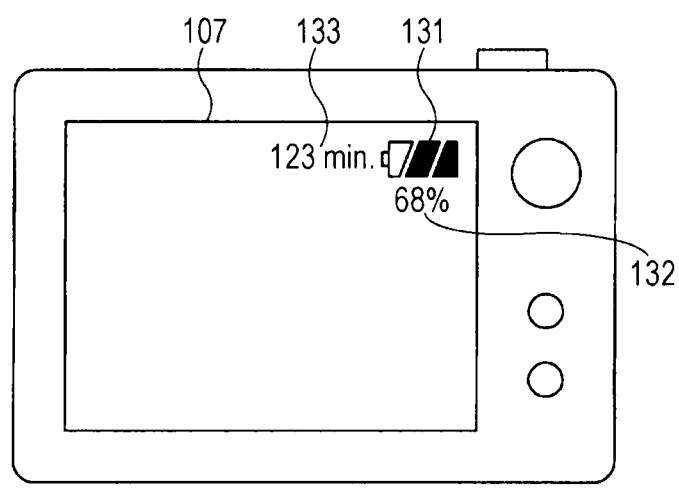
FIG. 2 illustrates exemplary information displayed by an interchangeable-lens camera main unit.

FIG. 2 illustrates exemplary information displayed by an interchangeable-lens camera main unit 100 of an interchangeable-lens camera 10 in accordance with an embodiment of the present technology. Hereinafter, exemplary information displayed by an interchangeable-lens camera main unit 100 will be described using FIG. 2.

FIG. 2 illustrates a state where information regarding the remaining capacity of a battery pack 200 is being displayed on a liquid-crystal panel 107 of an interchangeable-lens camera main unit 100. In the illustration in FIG. 2, a segmented cell display 131, a percent display 132, and a minutes display 133 are displayed on the liquid-crystal panel 107 of the interchangeable-lens camera main unit 100 as information regarding the remaining capacity of the battery pack 200.

The segmented cell display 131 shows a "full" display (all cells are displayed) in the case where the battery pack 200 is in a fully charged state, and shows an "empty" display (no cells are displayed) in the case where the battery pack 200 has no remaining charge. For states between a state of full charge and a state of no remaining charge in the battery pack 200, the segmented cell display 131 varies the number of displayed cells according to the particular capacity.

The percent display 132 shows 100% in the case where the battery pack 200 is in a fully charged state, and shows 0% in the case where the battery pack 200 has no remaining charge. For states therebetween, the percent display 132 is displayed in 1% increments according to the remaining capacity of the battery pack 200.

The minutes display 133 displays the remaining amount of usable time for the interchangeable-lens camera 10, in units of minutes. The user of the interchangeable-lens camera 10 is able to ascertain the charge state of the battery pack 200 and the amount of usable time by means of the segmented cell display 131, the percent display 132, and the minutes display 133 displayed on the liquid-crystal panel 107.

The foregoing thus describes exemplary information displayed by an interchangeable-lens camera main unit 100 using FIG. 2. Next, functional configurations of respective apparatus constituting an interchangeable-lens camera 10 in accordance with an embodiment of the present technology will be described.

Figure 3:
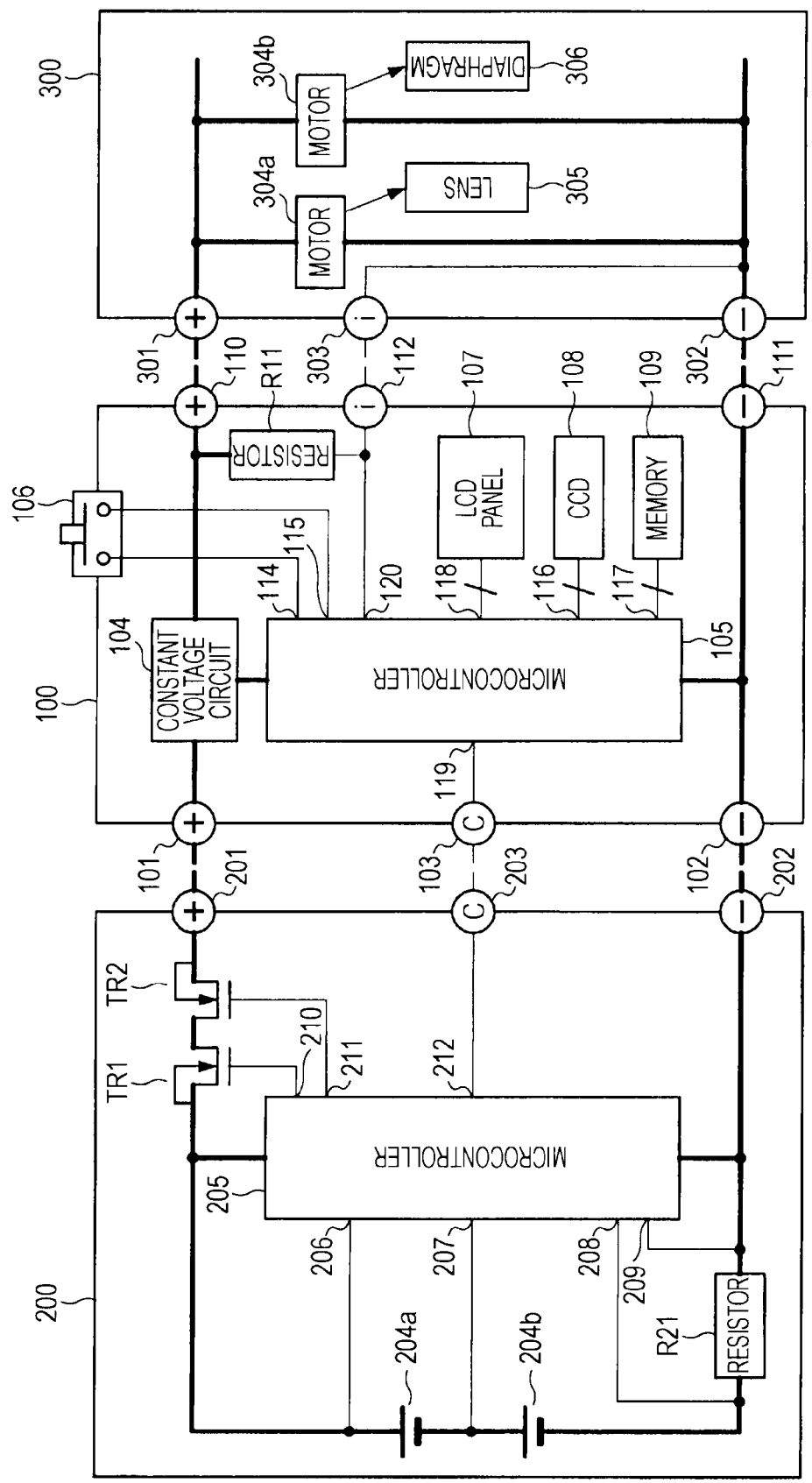
FIG. 3 illustrates functional configurations of respective apparatus constituting an interchangeable-lens camera in accordance with an embodiment of the present technology.

1-3. Functional Configurations of Respective Apparatus in Interchangeable-Lens Camera FIG. 3 illustrates functional configurations of respective apparatus constituting an interchangeable-lens camera 10 in accordance with an embodiment of the present technology. Hereinafter, functional configurations of respective apparatus constituting an interchangeable-lens camera 10 in accordance with an embodiment of the present technology will be described using FIG. 3.

As illustrated in FIG. 3, the interchangeable-lens camera main unit 100 includes a plus terminal 101, a minus terminal 102, a C terminal 103, a constant voltage circuit 104, a microcontroller 105, a shutter button 106, a liquid crystal panel 107, a CCD image sensor 108, memory 109, a plus terminal 110, a minus terminal 111, an i terminal 112, and a pull-up resistor R11.

Also, as illustrated in FIG. 3, the battery pack 200 includes a plus terminal 201, a minus terminal 202, a C terminal 203, cells 204a and 204b, a charge protection FET TR1, a discharge protection FET TR2, a current detection resistor R21, and a microcontroller 205.

Additionally, as illustrated in FIG. 3, the interchangeable lens 300 includes a plus terminal 301, a minus terminal 302, an i terminal 303, motors 304a and 304b, a lens 305, and a diaphragm 306.

The plus terminal 101 and the minus terminal 102 are terminals connected to the plus terminal 201 and the minus terminal 202 of the battery pack 200. By inserting the battery pack 200 into the interchangeable-lens camera main unit 100 and connecting the plus terminal 101 with the minus terminal 102 and the plus terminal 201 with the minus terminal 202, a supply of power can be received from the battery pack 200 or power can be supplied to the battery pack 200.

The C terminal 103 is a terminal connected to the C terminal 203 of the battery pack 200. By connecting the C terminal 103 of the interchangeable-lens camera main unit 100 with the C terminal 203 of the battery pack 200, the interchangeable-lens camera main unit 100 is able to communicate with the battery pack 200.

The constant voltage circuit 104 is a component that converts power supplied from an external power source into a constant voltage and supplies it to the microcontroller 105. The constant voltage circuit 104 also has functions for converting power supplied from the battery pack 200 into a constant voltage and supplying it to the interchangeable lens 300.

The microcontroller 105 is a component that operates by receiving a supply of power from the constant voltage circuit 104, and thereby controls operation of the interchangeable-lens camera main unit 100, the battery pack 200, and the interchangeable lens 300.

The microcontroller 105 is provided with input/output ports 114, 115, and 119 as well as an input port 120, and additionally, is connected to buses 116, 117, and 118.

The shutter button 106 is a button for shooting an image. When the shutter button 106 is pressed by the user, the microcontroller 105 is able to detect the pressing of the shutter button 106 by means of the input/output ports 114 and 115. The microcontroller 105 executes given imaging operations upon detection of the pressing of the shutter button 106.

The liquid crystal panel 107 is a component upon which shot images and various information are displayed. For example, when the microcontroller 105 detects by means of the input/output ports 114 and 115 that the shutter button 106 has been pressed, data from the CCD image sensor 108 is acquired by the bus 116, and the acquired data is recorded to the memory 109 via the bus 117. After that, the microcontroller 105 reads out the shot data from the memory 109 via the bus 117 and displays it on the liquid crystal panel 107 via the bus 118.

As another example, when the microcontroller 105 acquires a voltage, current, and current integration value for the battery pack 200 on the input/output port 119 by means of communication with the battery pack 200 via the C terminal 103, the microcontroller 105 calculates the remaining battery level of the battery pack 200 and displays it on the liquid crystal panel 107.

The CCD image sensor 108 is a component that obtains image data of a shot subject. The CCD image sensor 108 supplies image data to the microcontroller 105. The microcontroller 105 receives image data supplied from the CCD image sensor 108 and records it to the memory 109 or displays it on the liquid crystal panel 107.

The memory 109 is a recording medium to which image data of a shot subject is recorded. Image data recorded to the memory 109 is displayed on the liquid crystal panel 107 on the basis of user operations.

The plus terminal 110 and the minus terminal 111 are terminals connected to the plus terminal 301 and the minus terminal 302 of the interchangeable lens 300. Also, the i terminal 112 is a terminal connected to the i terminal 303 of the interchangeable lens 300.

When the interchangeable lens 300 is mounted onto the interchangeable-lens camera main unit 100, the plus terminal 110 and the minus terminal 111 of the interchangeable-lens camera main unit 100 are connected to the plus terminal 301 and the minus terminal 302 of the interchangeable lens 300, and power is supplied from the interchangeable-lens camera main unit 100 to the interchangeable lens 300.

At the same time, when the interchangeable lens 300 is mounted onto the interchangeable-lens camera main unit 100, the i terminal 112 of the interchangeable-lens camera main unit 100 is connected to the i terminal 303 of the interchangeable lens 300. By connecting the i terminal 112 of the interchangeable-lens camera main unit 100 to the i terminal 303 of the interchangeable lens 300, the interchangeable-lens camera main unit 100 is able to detect the mounted state of the interchangeable lens 300.

When the interchangeable lens 300 is not mounted onto the interchangeable-lens camera main unit 100, the input port 120 of the microcontroller 105 goes high due to the pull-up resistor R11.

Since the i terminal 303 of the interchangeable lens 300 is linked to the minus terminal 302, the i terminal 112 of the interchangeable-lens camera main unit 100 is connected to the i terminal 303 of the interchangeable lens 300 when the interchangeable lens 300 is mounted onto the interchangeable-lens camera main unit 100, and thus the input port 120 of the microcontroller 105 goes low.

Consequently, the microcontroller 105 is able to determine that the interchangeable lens 300 is not mounted when the input port 120 is high, and is able to determine that the interchangeable lens 300 is mounted when the input port 120 is low.

The plus terminal 201 and the minus terminal 202 are terminals connected to the plus terminal 101 and the minus terminal 102 of the interchangeable-lens camera main unit 100. By inserting the battery pack 200 into the interchangeable-lens camera main unit 100 and connecting the plus terminal 101 and the minus terminal 102 to the plus terminal 201 and the minus terminal 202, the battery pack 200 is able to supply power to the interchangeable-lens camera main unit 100 or receive a supply of power from the interchangeable-lens camera main unit 100.

The C terminal 203 is a terminal connected to the C terminal 103 of the interchangeable-lens camera main unit 100. By connecting the C terminal 103 of the interchangeable-lens camera main unit 100 to the C terminal 203 of the battery pack 200, the battery pack 200 is able to communicate with the interchangeable-lens camera main unit 100.

The cells 204a and 204b are components that store power to be supplied to the interchangeable-lens camera main unit 100. Power stored in the cells 204a and 204b is supplied to the interchangeable-lens camera main unit 100 by inserting the battery pack 200 into the interchangeable-lens camera main unit 100 and connecting the plus terminal 101 and the minus terminal 102 to the plus terminal 201 and the minus terminal 202.

Although a configuration is illustrated in the present embodiment wherein two cells are connected in series, but it is needless to say that the cell connection configuration is not limited to such an example.

The microcontroller 205 measures the voltage of the cells 204a and 204b and the current flowing through the cells 204a and 204b, and sends information regarding the cells 204a and 204b to the interchangeable-lens camera main unit 100. The microcontroller 205 operates on power supplied from the cells 204a and 204b while the battery pack 200 is discharging, and on power supplied from the plus terminal 201 and the minus terminal 202 while the battery pack 200 is charging.

The microcontroller 205 includes AD ports 206 and 207, and is able to measure the voltages of the cells 204a and 204b.

Also, the microcontroller 205 includes AD ports 208 and 209, and is able to measure the voltage at either end of the current detection resistor R21. Since the resistance value of the current detection resistor R21 is saved in internal memory (not illustrated) as an established value, the microcontroller 205 is able to calculate the current being discharged from the battery pack 200 or charged to the battery pack 200 by dividing the voltage value by the resistance value.

In the case of abnormal voltages and currents as measured by the above methods, the microcontroller 205 switches off the charge protection FET TR1 via an output port 210 or the discharge protection FET TR2 via an output port 211. In so doing, the microcontroller 205 protects the cells 204a and 204b and the interchangeable-lens camera main unit 100 connected to the battery pack 200.

Also, the microcontroller 205 saves the 100% capacity of a battery pack 200 in a brand-new state to memory (not illustrated). The microcontroller 205 calculates the total current integration value currently stored in the cells 204a and 204b by integrating the current as measured by the above method at a fixed time interval, and saves it to memory (not illustrated).

The microcontroller 205 calculates the total current integration value currently charged to the cells 204a and 204b by integrating the current as measured by the above method at a fixed time interval and only when current flows in the charging direction. The microcontroller 205 calculates the number of charge/discharge cycles (Number of charge/discharge cycles=Charged current integration value/100% capacity of battery pack 200 in brand-new state), and saves the above values to memory (not illustrated).

The microcontroller 205 is able output the 100% capacity of a battery pack 200 in a brand-new state, the charge/discharge cycle count, and the current integration value obtained by the above methods by communication via an input/output port 212. The input/output port 212 is linked to the C terminal 203 and is configured to be able to communicate with apparatus outside the battery pack 200 (the interchangeable-lens camera main unit 100).

The plus terminal 301 and the minus terminal 302 are terminals connected to the plus terminal 110 and the minus terminal 111 of the interchangeable-lens camera main unit 100. Also, the i terminal 303 is a terminal connected to the i terminal 112 of the interchangeable-lens camera main unit 100.

The motor 304a is a motor that drives the lens 305. Also, the motor 304b is a motor that drives the diaphragm 306. As a result of the motor 304a driving the lens 305, focus and zoom is adjusted, and as a result of the motor 304b driving the diaphragm 306, exposure is adjusted. The motors 304a and 304b operate on power supplied from the plus terminal 301 and the minus terminal 302.

The foregoing thus describes functional configurations of the respective apparatus constituting an interchangeable-lens camera 10 in accordance with an embodiment of the present technology using FIG. 3. Next, a configuration that executes a communication process between an interchangeable-lens camera main unit 100 and a battery pack 200 in accordance with an embodiment of the present technology will be described.

1-4. Configuration Executing a Communication Process

Figure 4:
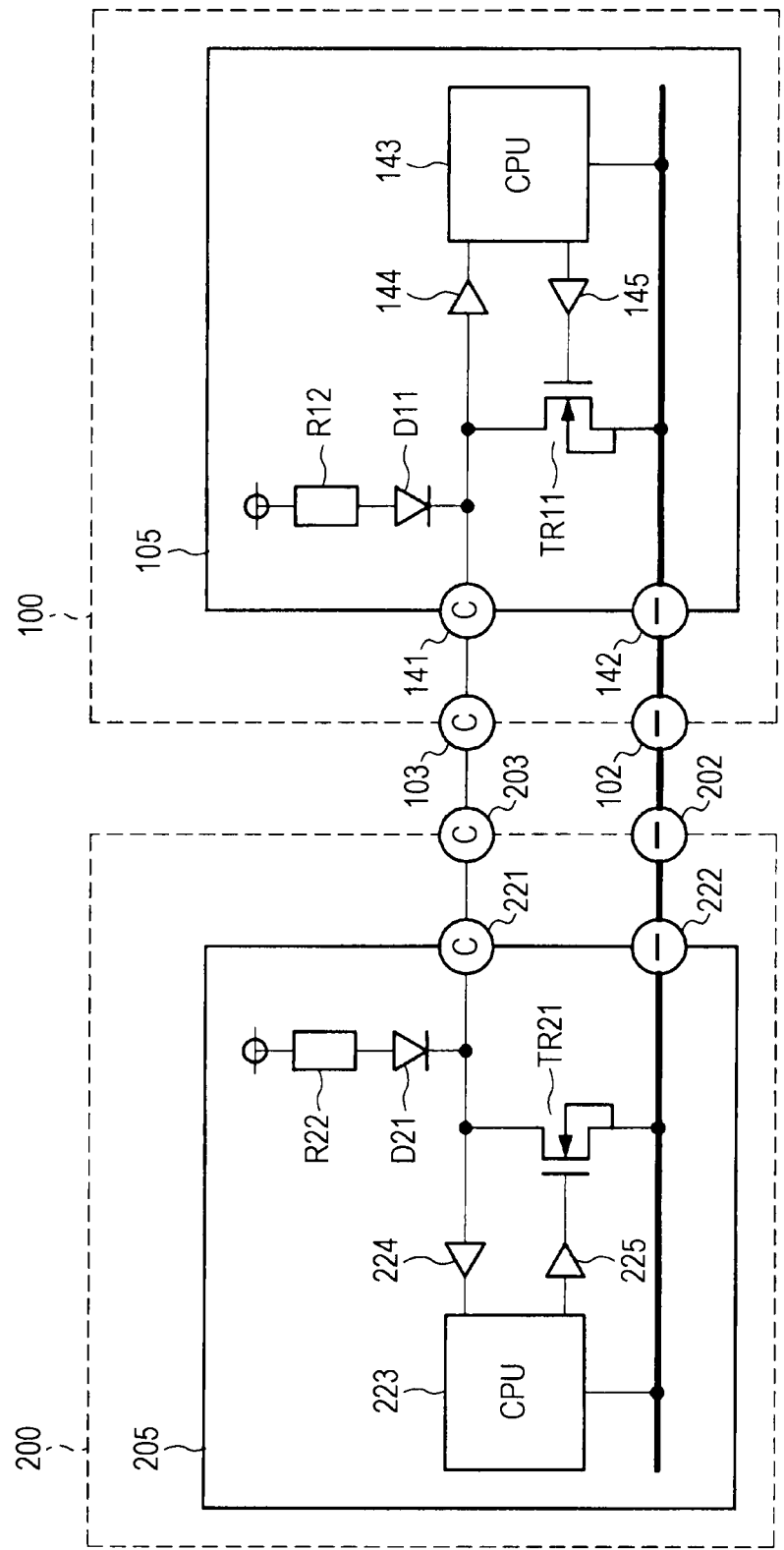
FIG. 4 illustrates a configuration that executes a communication process between an interchangeable-lens camera main unit and a battery pack in accordance with an embodiment of the present technology.

FIG. 4 is an explanatory diagram illustrating a configuration that executes a communication process between an interchangeable-lens camera main unit 100 and a battery pack 200 in accordance with an embodiment of the present technology.

Hereinafter, a configuration that executes a communication process between an interchangeable-lens camera main unit 100 and a battery pack 200 in accordance with an embodiment of the present technology will be described using FIG. 4.

As illustrated in FIG. 4, the microcontroller 105 of the interchangeable-lens camera main unit 100 includes an input/output port 141, GND 142, a CPU 143, an input buffer 144, an output buffer 145, a pull-up resistor R12, an output FET TR11, and a pull-up diode D11.

Figure 5:
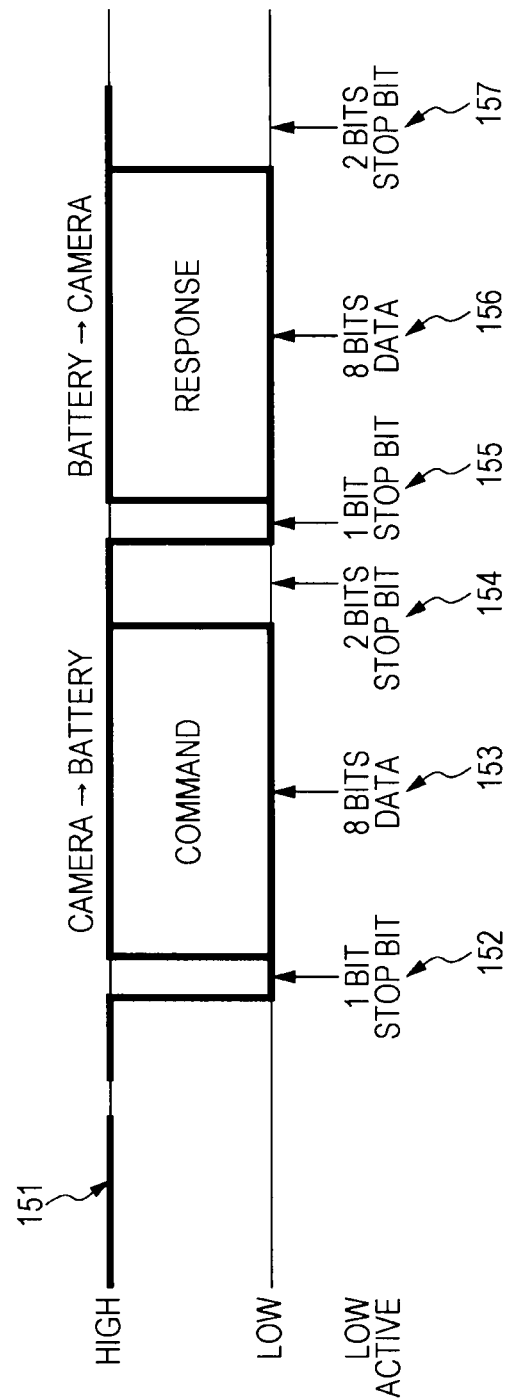
FIG. 5 is a timing chart for communication between an interchangeable-lens camera main unit and a battery pack.

Meanwhile, as illustrated in FIG. 5, the microcontroller 205 of the battery pack 200 includes an input/output port 221, a GND 222, a CPU 223, an input buffer 224, an output buffer 225, a pull-up resistor R22, an output FET TR21, and a pull-up diode D21.

The GND 222 of the microcontroller 205 in the battery pack 200 is connected to the GND 142 of the microcontroller 105 in the interchangeable-lens camera main unit 100 via the minus terminal 202 of the battery pack 200 and the minus terminal 102 of the interchangeable-lens camera main unit 100.

The input/output port 221 of the microcontroller 205 in the battery pack 200 is connected to the input/output port 141 of the microcontroller 105 in the interchangeable-lens camera main unit 100 via the C terminal 203 of the battery pack 200 and the C terminal 103 of the interchangeable-lens camera main unit 100.

In the case where the microcontroller 205 in the battery pack 200 wants to output low to the C terminal 203 in the battery pack 200, the microcontroller 205 outputs high with the output buffer 225. In so doing, the output FET TR21 switches on, the input/output port 221 goes low, and the C terminal 203 goes low.

In contrast, in the case where the microcontroller 205 in the battery pack 200 wants to output high at the C terminal 203 in the battery pack 200, the microcontroller 205 outputs low at the output buffer 225. In so doing, the output FET TR21 switches off, the input/output port 221 goes high due to the pull-up resistor R22 and the pull-up diode D21, and the C terminal 203 goes high.

The microcontroller 205 in the battery pack 200 is able to ascertain whether the C terminal 203 in the battery pack 200 is high or low via the input buffer 224.

In the case where the microcontroller 105 in the interchangeable-lens camera main unit 100 wants to output low at the C terminal 103 in the interchangeable-lens camera main unit 100, the microcontroller 105 outputs high at the output buffer 145. In so doing, the output FET TR11 switches on, the input/output port 141 goes low, and the C terminal 103 goes low.

In contrast, in the case where the microcontroller 105 in the interchangeable-lens camera main unit 100 wants to output high at the C terminal 103 in the interchangeable-lens camera main unit 100, the microcontroller 105 outputs low at the output buffer 145. In so doing, the output FET TR11 switches off, the input/output port 141 goes high due to the pull-up resistor R12 and the pull-up diode D11, and the C terminal 103 goes high.

The microcontroller 105 in the interchangeable-lens camera main unit 100 is able to ascertain whether the C terminal 103 in the interchangeable-lens camera main unit 100 is high or low via the input buffer 144.

FIG. 5 is a timing chart for communication between an interchangeable-lens camera main unit 100 and a battery pack 200.

Before communication between the interchangeable-lens camera main unit 100 and the battery pack 200 is conducted, both the output FET TR21 in the battery pack 200 and the output FET TR11 in the interchangeable-lens camera main unit 100 are off, and the communication line is high (sign 151).

When initiating communication, the microcontroller 105 in the interchangeable-lens camera main unit 100 switches on the output FET TR11 for just an amount of time equivalent to one bit of communication data, and makes the communication line go low (sign 152). The microcontroller 105 in the interchangeable-lens camera main unit 100 and the microcontroller 205 in the battery pack 200 synchronize their communication timings on the basis of this low period equivalent to one bit of communication data.

Next, the microcontroller 105 in the interchangeable-lens camera main unit 100 transmits an 8-bit command (sign 153). The microcontroller 105 in the interchangeable-lens camera main unit 100 switches off the output FET TR11 for the high output bits, and switches on the output FET TR11 for the low output bits.

The microcontroller 205 in the battery pack 200 receives the high/low output sent from the microcontroller 105 in the interchangeable-lens camera main unit 100 via the input buffer 224.

Next, the microcontroller 105 in the interchangeable-lens camera main unit 100 transmits 2-bit stop bits (sign 154). The microcontroller 205 in the battery pack 200 confirms the end of communication with the 2-bit stop bits.

Next, the microcontroller 105 in the interchangeable-lens camera main unit 100 switches on the output FET TR11 for just an amount of time equivalent to one bit of communication data, and makes the communication line go low (sign 155).

Next, the microcontroller 205 in the battery pack 200 transmits an 8-bit response (sign 156). The microcontroller 205 in the battery pack 200 switches off the output FET TR21 for high output bits, and switches on the output FET TR21 for low output bits.

The microcontroller 105 in the interchangeable-lens camera main unit 100 receives the high/low output via the input buffer 144.

Next, the microcontroller 105 in the interchangeable-lens camera main unit 100 transmits 2-bit stop bits (sign 157). The microcontroller 205 in the battery pack 200 confirms the end of communication with the 2-bit stop bits.

According to the sequential flow above, one communication session between the interchangeable-lens camera main unit 100 and the battery pack 200 is completed.

FIG. 6 illustrates exemplary contents of communication data transmitted between an interchangeable-lens camera main unit 100 and a battery pack 200.

When the microcontroller 105 in the interchangeable-lens camera main unit 100 transmits "0x01" (sign 181) as a command (sign 153), the microcontroller 205 in the battery pack 200 transmits the 100% capacity of a brand-new battery (sign 182) as a response (sign 156).

When the microcontroller 105 in the interchangeable-lens camera main unit 100 transmits "0x02" (sign 183) as a command (sign 153), the microcontroller 205 in the battery pack 200 transmits the charge/discharge cycle count (sign 184) as a response (sign 156).

When the microcontroller 105 in the interchangeable-lens camera main unit 100 transmits "0x03" (sign 185) as a command (sign 153), the microcontroller 205 in the battery pack 200 transmits the current integration value (sign 186) as a response (sign 156).

Obviously, the commands and responses illustrated in FIG. 6 are exemplary, and it is needless to say that the present technology is not limited to such examples. Also, it is needless to say that the present technology is not limited to such examples with regard to the numbers of bits in the respective data illustrated in FIG. 5.

The foregoing thus describes a configuration that executes a communication process between an interchangeable-lens camera main unit 100 and a battery pack 200 in accordance with an embodiment of the present technology. Next, operation of an interchangeable-lens camera 10 in accordance with an embodiment of the present technology will be described.

1-5. Operation of Interchangeable-Lens Camera

Figure 7:
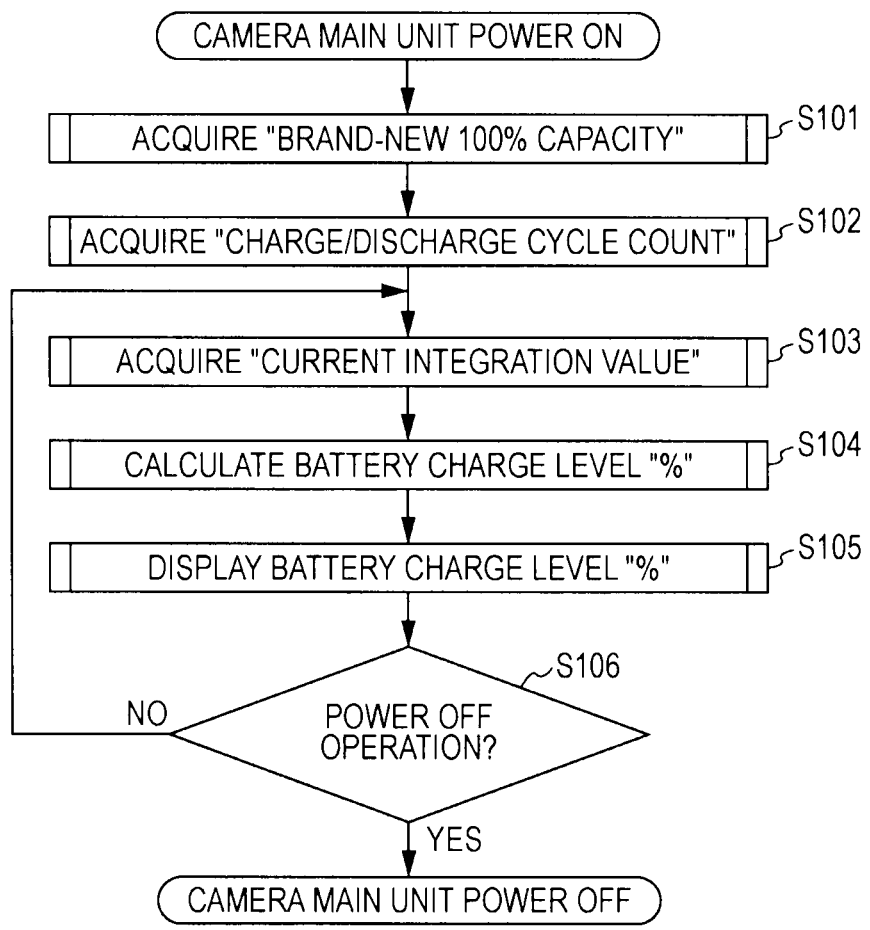
FIG. 7 is a flowchart illustrating operation of an interchangeable-lens camera in accordance with an embodiment of the present technology.

FIG. 7 is a flowchart illustrating operation of an interchangeable-lens camera 10 in accordance with an embodiment of the present technology. Hereinafter, operation of an interchangeable-lens camera 10 in accordance with an embodiment of the present technology will be described.

When the interchangeable-lens camera main unit 100 of the interchangeable-lens camera 10 is powered on by the user of the interchangeable-lens camera 10, the microcontroller 105 in the interchangeable-lens camera main unit 100 executes a process that displays the battery charge level of the battery pack 200 as a percentage.

First, the microcontroller 105 in the interchangeable-lens camera main unit 100 acquires information on the 100% capacity of a brand-new battery from the microcontroller 205 by means of communication between the interchangeable-lens camera main unit 100 and the battery pack 200 (operation S101).

Additionally, the microcontroller 105 in the interchangeable-lens camera main unit 100 acquires information on the charge/discharge cycle count of the battery pack 200 from the microcontroller 205 in the battery pack 200 by means of communication between the interchangeable-lens camera main unit 100 and the battery pack 200 (operation S102).

Additionally, the microcontroller 105 in the interchangeable-lens camera main unit 100 acquires information on the current integration value of the battery pack 200 from the microcontroller 205 in the battery pack 200 by means of communication between the interchangeable-lens camera main unit 100 and the battery pack 200 (operation S103).

In a battery such as a lithium-ion battery, internal resistance in the cells typically increases with repeated charges/discharges, which is called "wear". As a battery wears down, its usable current integration value which can be stored in its cells at full charge decreases compared to a brand-new battery.

Consequently, the microcontroller 105, having acquired information on the 100% capacity of a brand-new battery, information on the charge/discharge cycle count of the battery pack 200, and information on the current integration value of the battery pack 200, corrects the current integration value for which 100% is displayed according to the charge/discharge cycle count, in order to display the battery charge level on the liquid crystal panel 107.

The microcontroller 105 calculates the battery charge level of the battery pack 200 by correcting the current integration value according to the following formulas (operation S104), and displays the calculated battery charge level on the liquid crystal panel 107 as a percentage (operation S105).

$$F = F0 \times (1 - K \times N/100)$$

F: 100% capacity of current battery [Ah]
F0: 100% capacity of brand-new battery [Ah]
K: Correction coefficient [%/cycle]
N: Charge/discharge cycle count [cycles]

$$P = (S/F) \times 100$$

P: Battery charge level percentage [%]
S: Current integration value [Ah]
F: 100% capacity of current battery [Ah]

Herein, in the above formulas, the correction coefficient K is a fixed value saved in the microcontroller 105 at the time of shipping the interchangeable-lens camera main unit 100.

Next, the microcontroller 105 in the interchangeable-lens camera main unit 100 periodically determines whether or not the interchangeable-lens camera main unit 100 has been powered off by the user (operation S106). If the interchangeable-lens camera main unit 100 has not been powered off, the process returns to the above operation S103, and the microcontroller 105 acquires information on the current integration value of the battery pack 200 from the microcontroller 205 in the battery pack 200. In contrast, if the interchangeable-lens camera main unit 100 has been powered off, the process ends directly.

Figure 8:
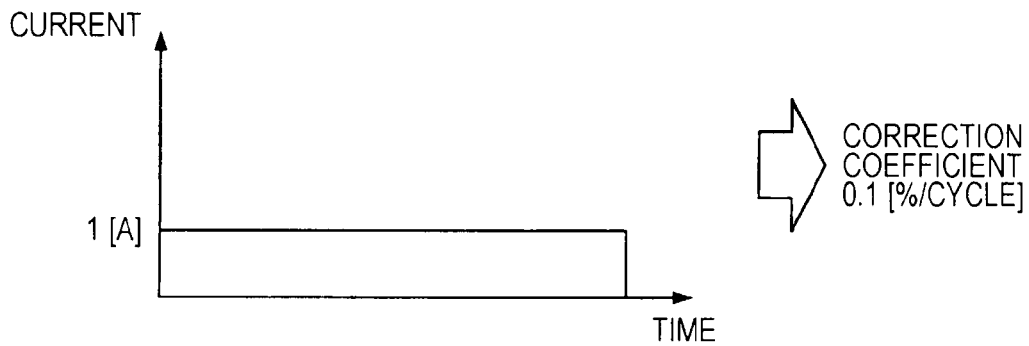
FIG. 8 illustrates the relationship between a current profile and a correction coefficient in an interchangeable-lens camera in accordance with an embodiment of the present technology.
Figure 9:
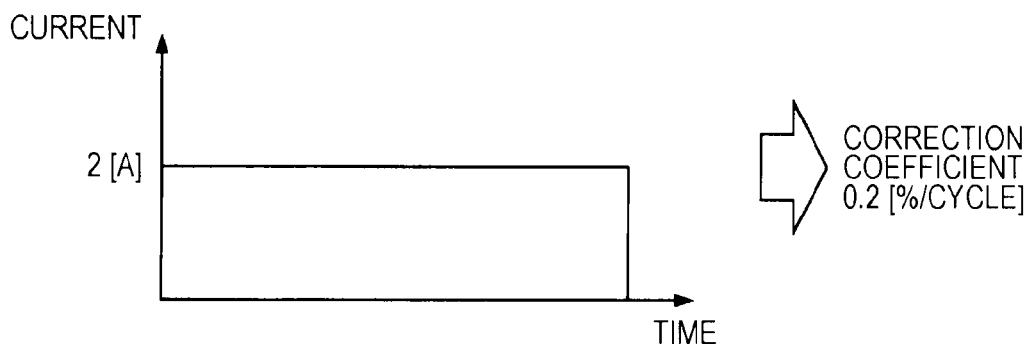
FIG. 9 illustrates the relationship between a current profile and a correction coefficient in an interchangeable-lens camera in accordance with an embodiment of the present technology.
Figure 10:
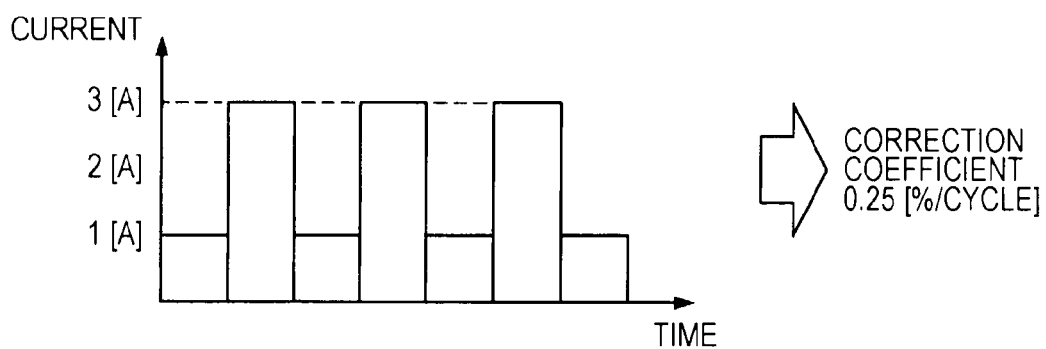
FIG. 10 illustrates the relationship between a current profile and a correction coefficient in an interchangeable-lens camera in accordance with an embodiment of the present technology.

FIGS. 8 to 10 illustrate relationships between a current profile and a correction coefficient in an interchangeable-lens camera 10 in accordance with an embodiment of the present technology.

The correction coefficient K ([%/cycle]) discussed above is determined according to how the interchangeable-lens camera main unit 100 of the interchangeable-lens camera 10 and the interchangeable lens 300 mounted onto the interchangeable-lens camera main unit 100 use current.

In the case of a battery such as a lithium-ion battery, the correction coefficient K ([%/cycle]) typically increases with increased power consumption. For example, the correction coefficient K=0.1 [%/cycle] in the case of a steadily flowing 1 A current, as illustrated in FIG. 8. As another example, the correction coefficient K=0.2 [%/cycle] in the case of a steadily flowing 2 A current, as illustrated in FIG. 9.

Also, in the case of a battery such as a lithium-ion battery, the correction coefficient K ([%/cycle]) for the case of an intermittently flowing current is typically larger than for the case of a steadily flowing current, even if the average current is the same.

For example, the correction coefficient K=0.2 [%/cycle] in the case of a steadily flowing 2 A current, as illustrated in FIG. 9. However, the correction coefficient K=0.25 [%/cycle] in the case of an alternating flow of a 1 A current for one second and a 3 A current for one second, for example, as illustrated in FIG. 10.

How current is used often depends on product specifications. In other words, in the case where the interchangeable-lens camera 10 is a camera that shoots motion images, current often flows steadily as in FIGS. 8 and 9, whereas in the case where the interchangeable-lens camera 10 is a camera that shoots still images, current often flows intermittently as in FIG. 10.

Taking such considerations into account, "K: Correction coefficient [%/cycle]" is determined at the time of product shipping of the interchangeable-lens camera 10 and saved in the microcontroller 105. The correction coefficient K saved in the microcontroller 105 is used when calculating the battery charge level in the above operation S104.

FIG. 11 illustrates an exemplary correction coefficient table. In the case of a battery such as a lithium-ion battery, the correction coefficient K [%/cycle] typically varies according to how current flows, as described above.

How current flows can be defined by a combination of an average current and a peak current, and "K: Correction coefficient [%/cycle]" if given an average current and a peak current.

Thus, before shipping the battery pack 200, the battery pack 200 is first repeatedly discharged in a variety of patterns while varying the average current and the peak current, the degree to which the battery wears down is measured, and a correction coefficient table like that in FIG. 11 is created.

Next, before shipping the interchangeable-lens camera main unit 100, the average current and the peak current when using the interchangeable-lens camera main unit 100 are measured, and the correction coefficient K [%/cycle] at the relevant location in a premade correction coefficient table is saved in the microcontroller 105.

In so doing, an interchangeable-lens camera main unit 100 in accordance with an embodiment of the present technology is able to use a determined correction coefficient K to calculate the 100% capacity of the current battery. Furthermore, by calculating the 100% capacity of the current battery, it becomes possible for an interchangeable-lens camera main unit 100 in accordance with an embodiment of the present technology to present a more accurate battery charge level.

In the case of a battery such as a lithium-ion battery, the degree of wear also typically depends on the battery cell material, etc. Thus, a dimensionless correction coefficient J different from the above correction coefficient K is also prepared and saved in the microcontroller 205 in the battery pack 200 at the time of manufacturing the battery pack 200. The microcontroller 105 may then acquire the correction coefficient J by means of communication between the microcontroller 105 and the microcontroller 205 and use it to calculate the current 100% capacity of the battery. The current 100% capacity of the battery is calculated at that point as follows.

$$F = F0 \times (1 - J \times K \times N/100)$$

F: current 100% capacity of battery [Ah]
F0: 100% capacity of brand-new battery [Ah]
K: Correction coefficient [%/cycle]
J: Correction coefficient (dimensionless)
N: Charge/discharge cycle count [cycles]

By calculating the current 100% capacity [Ah] of the battery pack 200 according to the above formula, it becomes possible to display a more accurate battery charge level as a percentage.

However, the correction coefficient K and the correction coefficient J may be determined as a single value at the time of shipping, or may be dynamically determined when calculating the current 100% capacity of the battery. By using a suitable correction coefficient according to how the user uses the interchangeable-lens camera 10 (whether the user primarily shoots motion images, whether the user primarily shoots still images, what kind of lens the user uses), it becomes possible to display a more accurate battery charge level. Hereinafter, a process which dynamically determines a correction coefficient used when calculating the current 100% capacity of a battery and which is conducted by an interchangeable-lens camera main unit 100 in accordance with an embodiment of the present technology will be described.

Figure 12:
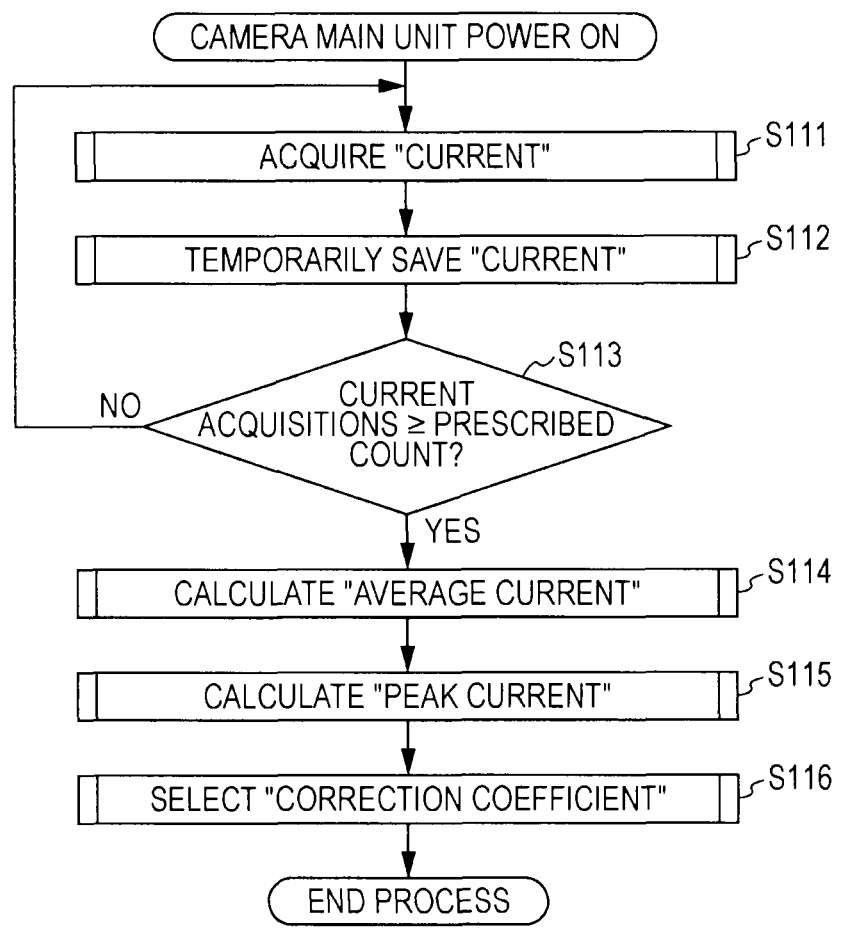
FIG. 12 is a flowchart illustrating a process which dynamically determines a correction coefficient used when calculating the current 100% capacity of a battery and which is conducted by an interchangeable-lens camera main unit in accordance with an embodiment of the present technology.

FIG. 12 is a flowchart illustrating a process which dynamically determines a correction coefficient used when calculating the current 100% capacity of a battery and which is conducted by an interchangeable-lens camera main unit 100 in accordance with an embodiment of the present technology.

When the interchangeable-lens camera main unit 100 of the interchangeable-lens camera 10 is powered on by the user of the interchangeable-lens camera 10, the microcontroller 105 in the interchangeable-lens camera main unit 100 executes a process that dynamically determines a correction coefficient used when calculating the current 100% capacity of a battery. Herein, all or part of the correction coefficient table illustrated in FIG. 11 is taken to be saved in the microcontroller 105.

The microcontroller 205 in the battery pack 200 is able to retain the resistance value of the current detection resistor R21 as an established value. Consequently, current discharged from or charged to the battery pack 200 can be calculated by dividing the voltage value by the resistance value. Consequently, the microcontroller 205 calculates a current value discharged from or charged to the battery pack 200, and transmits it to the microcontroller 105 in the interchangeable-lens camera main unit 100. The microcontroller 105 acquires the current value transmitted from the battery pack 200 (operation S111), and temporarily saves the acquired current value internally in the microcontroller 105 (operation S112).

Upon acquiring and saving a current value transmitted from the battery pack 200, the microcontroller 105 subsequently determines whether or not the acquisition count for the current value transmitted from the battery pack 200 has reached a prescribed count or greater (operation S113).

If the result of the determination in the above operation S113 is such that the current value acquisition count is less than the prescribed count, the process returns to the above operation S111 and the microcontroller 105 continues to acquire current values from the battery pack 200. In contrast, if the result of the determination in the above operation S113 is such that the current value acquisition count is equal to or greater than the prescribed count, the microcontroller 105 calculates the average current (operation S114) and the peak current (operation S115) from the saved current value information.

Once the microcontroller 105 calculates the average current and the peak current of the current flowing through the battery pack 200 in the above operation S114 and operation S115, the microcontroller 105 uses those average current and peak current values to select a correction coefficient from the correction coefficient table illustrated in FIG. 11 (operation S116). For example, if the average current is 1 A and the peak current is 3 A, the microcontroller 105 selects "0.17" as the value of the correction coefficient.

In this way, by calculating an average current and a peak current for current flowing through the battery pack 200 and determining a correction coefficient on the basis of the average current and peak current, it is possible to compute the current 100% capacity of a battery by means of a correction coefficient that corresponds to how a user uses an interchangeable-lens camera 10 (whether the user primarily shoots motion images, whether the user primarily shoots still images, what kind of lens the user uses, etc.). Furthermore, it becomes possible to display a more accurate batter charge level compared to the case of using a correction coefficient that is fixed on a per-model basis.

Meanwhile, correction coefficient tables that differ for each type of battery pack according to capacity differences, etc. may be provided, and a correction coefficient table may be dynamically determined according to the type of battery pack 200 inserted into the interchangeable-lens camera main unit 100. In that case, it may be configured such that the microcontroller 105 saves information on correction coefficient tables that differ for each type of battery pack, while in addition, the microcontroller 105 acquires information on the battery type from the battery pack 200 after power-on in the flowchart illustrated in FIG. 12. Also, besides saving correction coefficient tables that differ for each type of battery pack, the results of multiplying the values in one correction coefficient table by given values may be taken as correction coefficients for other types of battery packs.

2. CONCLUSION

According to an embodiment of the present technology as described above, the current 100% capacity of a battery is calculated using the 100% capacity of a battery pack 200 in a brand-new state, the charge/discharge cycle count of the battery pack 200, and the current integration value of the battery pack 200. When calculating the current 100% capacity of the battery, the current 100% capacity of the battery is calculated using a correction coefficient unique to the battery pack 200.

Thus, even if the magnitude of the current and the way in which the current flows differ, the current 100% capacity of the battery can be calculated using a correction coefficient able to reflect that magnitude of the current and way in which the current flows. In so doing, an interchangeable-lens camera 10 in accordance with an embodiment of the present technology is able to calculate a more accurate battery charge level and display that battery charge level. Also, even if the magnitude of the current and way in which the current flows greatly differ according to device, an interchangeable-lens camera 10 in accordance with an embodiment of the present technology is able to calculate a battery charge level and display that battery charge level without preparing another battery for charge level calculation.

Also, although in the related art the 100% capacity of a battery has also been corrected in a battery pack 200, by combining with this correction in a battery pack 200 it becomes possible to correct the 100% capacity of a battery while taking into account the properties of the battery cells, and the magnitude of current and the way in which current flows in a device. Thus, it becomes possible to calculate and display a more accurate battery charge level.

Also, by measuring the actual current flowing through the battery pack 200 and selecting a correction coefficient based on the actual measurement results, it becomes possible to correct the 100% capacity of a battery for individual users who use a device differently, even if the model is the same. Thus, it becomes possible to calculate and display a more accurate battery charge level.

Herein, the series of processes described in the above embodiment may be executed by special-purpose hardware, but may also be executed in software (an application). In the case of conducting the series of processes in software, the above series of processes may be realized by executing a computer program on a general-purpose or special-purpose computer.

The foregoing thus describes an ideal embodiment of the present technology in detail and with reference to the attached drawings, but the present technology is not limited to such an example. It is apparent that persons ordinarily skilled in the art to which the present technology belongs may make various modifications and substitutions within the domain of technical ideas stated in the claims, and it is to be understood that such modifications and substitutions naturally belong within the technical scope of the present technology.

For example, in the above embodiment, it is configured such that current integration value information is transmitted from the battery pack 200 to the interchangeable-lens camera main unit, but the present technology is not limited to such an example. In other words, it may also be configured such that current value information as measured by the battery pack 200 is successively received by the microcontroller 105 in the interchangeable-lens camera main unit 100 from the battery pack 200, and the current integration value information is calculated by the microcontroller 105.

The present disclosure contains subject matter related to that disclosed in Japanese Priority Patent Application JP 2010-278148 filed in the Japan Patent Office on Dec. 14, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device, comprising:
    circuitry configured to:
    receive at least information on a full-charge capacity of a currently inserted battery apparatus having secondary cells in a brand-new state, a battery charge/discharge cycle count of the battery apparatus, and a first correction coefficient specific to the battery apparatus transmitted from the battery apparatus;
    retain a plurality of second correction coefficients, each of the second correction coefficients representing a degree of wear of the battery apparatus per one battery charge/discharge cycle;
    calculate an average current value and a peak current value of detected current values for a charge/discharge current flowing through the battery apparatus;
    dynamically select one of the plurality of the second correction coefficients based on the calculated average current value and the calculated peak current value; and
    calculate a current full-charge capacity of the battery apparatus using the information on the full-charge capacity of the battery apparatus in a brand-new state, the battery charge/discharge cycle count, and the first correction coefficient, which are transmitted from the battery apparatus, and the selected second correction coefficient.

2. The electronic device according to claim 1, wherein the circuitry computes the current full-charge capacity of the battery apparatus according to the following formula:
    current full-charge capacity of the battery apparatus=full-charge capacity of the battery apparatus in a brand-new state×(1−first correction coefficient×second correction coefficient×battery charge/discharge cycle count).

3. The electronic device according to claim 1, wherein the circuitry is configured to:
    acquire a current integration value obtained by integrating the detected current values for the charge/discharge current flowing through the battery apparatus, and
    compute a battery charge level ratio of the battery apparatus using the current full-charge capacity of the battery apparatus and the current integration value.

4. The electronic device according to claim 3, further comprising:
    a display that displays information;
    wherein the circuitry causes the display to display the battery charge level ratio of the battery apparatus.

5. The electronic device according to claim 1, wherein the second correction coefficient is expressed by a unit expressed by [%/cycle].

6. The electronic device according to claim 1, wherein the first correction coefficient is expressed by a dimensionless unit.

7. The electronic device according to claim 1, wherein the circuitry is configured to determine whether or not an acquisition count for the detected current values is equal to or greater than a predetermined count, and the circuitry calculates the average current value and the peak current value only when the circuitry determines the acquisition count is equal to or greater than the predetermined count.

8. The electronic device according to claim 1, wherein the circuitry is configured to retain the plurality of the second correction coefficients as a correction coefficient table, each of the second correction coefficients in the correction coefficient table being identified by a combination of the average current value and the peak current value.

9. The electronic device according to claim 8, wherein the circuitry is configured to:
retain a plurality of the correction coefficient tables according to a type of the battery apparatus;
receive battery type information from the battery apparatus;
dynamically determine the correction coefficient table corresponding to the received battery type information from among the plurality of the correction coefficient tables; and
dynamically select one of the plurality of the second correction coefficients from the determined correction coefficient table based on the calculated average current value and the calculated peak current value.

10. The electronic device according to claim 8, wherein the circuitry is configured to:
receive battery type information from the battery apparatus;
multiply the correction coefficient table by a predetermined value based on the battery type information; and
dynamically select one of the plurality of the second correction coefficients from the multiplied correction coefficient table based on the calculated average current value and the calculated peak current value.

11. A method of computing battery pack capacity, comprising:
receiving at least information on a full-charge capacity of a currently inserted battery apparatus having secondary cells in a brand-new state, a battery charge/discharge cycle count of the battery apparatus, and a first correction coefficient specific to the battery apparatus transmitted from the battery apparatus;
retaining a plurality of second correction coefficients, each of the second correction coefficients representing a degree of wear of the battery apparatus per one battery charge/discharge cycle;
calculating an average current value and a peak current value of detected current values for a charge/discharge current flowing through the battery apparatus;
dynamically selecting one of the plurality of the second correction coefficients based on the calculated average current value and the calculated peak current value; and
calculating, using circuitry, a current full-charge capacity of the battery apparatus using the information on the full-charge capacity of the battery apparatus in a brand-new state, the battery charge/discharge cycle count, and the first correction coefficient, which are transmitted from the battery apparatus, and the selected second correction coefficient.

* * * * *